(12) United States Patent
Widmann et al.

(10) Patent No.: US 9,558,978 B2
(45) Date of Patent: Jan. 31, 2017

(54) MATERIAL HANDLING WITH DEDICATED AUTOMATED MATERIAL HANDLING SYSTEM

(71) Applicants: Amir Widmann, Haifa (IL); Michael Adel, Zichron (IL); Pati Sekula, Sunnyvale, CA (US)

(72) Inventors: Amir Widmann, Haifa (IL); Michael Adel, Zichron (IL); Pati Sekula, Sunnyvale, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 473 days.

(21) Appl. No.: 13/874,764

(22) Filed: May 1, 2013

(65) Prior Publication Data
US 2013/0294871 A1 Nov. 7, 2013

Related U.S. Application Data

(60) Provisional application No. 61/642,747, filed on May 4, 2012, provisional application No. 61/643,539, filed on May 7, 2012.

(51) Int. Cl.
*H01L 21/677* (2006.01)
(52) U.S. Cl.
CPC ..... *H01L 21/67733* (2013.01); *H01L 21/6773* (2013.01); *H01L 21/67727* (2013.01); *Y10T 29/49826* (2015.01)
(58) Field of Classification Search
CPC .................. H01L 21/67724; H01L 21/67778; H01L 21/67733; H01L 21/67736; H01L 21/67769; H01L 21/67727
See application file for complete search history.

(56) References Cited

U.S. PATENT DOCUMENTS

| 6,726,429 | B2 | 4/2004 | Sackett et al. |
| 6,990,721 | B2 | 1/2006 | Mariano et al. |
| 7,410,340 | B2 * | 8/2008 | Bonora ............ H01L 21/67775 414/940 |
| 7,679,715 | B2 | 3/2010 | Kruijswijk et al. |

(Continued)

FOREIGN PATENT DOCUMENTS

| CN | 102324397 A | 1/2012 |
| EP | 1184805 A1 | 3/2002 |

(Continued)

OTHER PUBLICATIONS

Chinese Office Action for CN Application No. 201380030350.6, dated May 5, 2016.

(Continued)

*Primary Examiner* — Gerald McClain
(74) *Attorney, Agent, or Firm* — Joshua D. Isenberg; JDI Patent (57) ABSTRACT

An apparatus includes a dedicated material handling module having a dedicated automated material handling system (AMHS) defines a transport route between a first tool and a second tool selected from a plurality of tools in a fabrication facility. The dedicated AMHS is configured to transport wafer carriers between the first tool and the second tool or vice versa independent of a fabrication facility AMHS that is configured to transport wafer carriers among the plurality of tools.

6 Claims, 3 Drawing Sheets

(56) References Cited

U.S. PATENT DOCUMENTS

| | | | |
|---|---|---|---|
| 7,771,153 B2* | 8/2010 | Doherty | H01L 21/67733 414/331.02 |
| 7,778,721 B2 | 8/2010 | Englhardt et al. | |
| 7,798,758 B2* | 9/2010 | Bufano et al. | 414/222.01 |
| 7,887,276 B2 | 2/2011 | Natume | |
| 8,047,762 B2 | 11/2011 | Zimmerhackl et al. | |
| 8,113,123 B2 | 2/2012 | Menser et al. | |
| 8,197,172 B2* | 6/2012 | Doherty | H01L 21/67733 414/331.02 |
| 8,267,634 B2* | 9/2012 | Bufano et al. | 414/217.1 |
| 8,328,495 B2 | 12/2012 | Bufano et al. | |
| 8,371,792 B2 | 2/2013 | Hofmeister et al. | |
| 8,651,025 B2 | 2/2014 | Chen et al. | |
| 8,944,739 B2* | 2/2015 | Chen | H01L 21/67733 414/939 |
| 2002/0197136 A1 | 12/2002 | Huang et al. | |
| 2004/0126208 A1* | 7/2004 | Tawyer | H01L 21/67769 414/222.02 |
| 2006/0285945 A1* | 12/2006 | Hofmeister et al. | 414/217 |
| 2007/0183871 A1* | 8/2007 | Hofmeister et al. | 414/332 |
| 2008/0063496 A1* | 3/2008 | Bufano | H01L 21/67733 414/331.01 |
| 2008/0080963 A1* | 4/2008 | Bufano et al. | 414/788 |
| 2008/0107507 A1* | 5/2008 | Bufano et al. | 414/217.1 |
| 2008/0232948 A1* | 9/2008 | van der Meulen | H01L 21/67161 414/805 |
| 2009/0035102 A1* | 2/2009 | Zimmerhackl | H01L 21/67769 414/222.04 |
| 2009/0185151 A1* | 7/2009 | Yamamoto | H01L 21/67733 355/53 |
| 2010/0080672 A1* | 4/2010 | Bonora et al. | 414/222.01 |
| 2012/0321417 A1 | 12/2012 | Bonora et al. | |
| 2016/0111308 A1* | 4/2016 | Bufano | H01L 21/67733 414/222.13 |

FOREIGN PATENT DOCUMENTS

| | | |
|---|---|---|
| EP | 1883958 A2 | 2/2008 |
| EP | 1141439 B1 | 12/2012 |
| TW | 200418702 B | 10/2004 |
| TW | 200902404 A | 1/2009 |
| TW | 201013347 A | 4/2010 |
| TW | 201312688 A1 | 3/2013 |

OTHER PUBLICATIONS

Taiwanese Office Action for TW Application No. 102115951, dated Oct. 5, 2016.

* cited by examiner

MATERIAL HANDLING WITH DEDICATED AUTOMATED MATERIAL HANDLING SYSTEM

CLAIM OF PRIORITY

This application is a nonprovisional of and claims the priority benefit of commonly owned, U.S. Provisional Patent Application No. 61/642,747, to Amir Widmann et al., filed May 4, 2012, and entitled "EFFICIENT MATERIAL HANDLING IN THE VICINITY OF A LITHOGRAPHY CELL", the entire disclosures of which are incorporated herein by reference.

This application is a nonprovisional of and claims the priority benefit of commonly owned, U.S. Provisional Patent Application No. 61/643,539, to Amir Widmann et al., filed May 7, 2012, and entitled "EFFICIENT MATERIAL HANDLING IN THE VICINITY OF A LITHOGRAPHY CELL", the entire disclosures of which are incorporated herein by reference.

FIELD OF THE DISCLOSURE

The present disclosure is relates generally to material handling systems, and more specifically to an automated material handling system (AMHS) in a semiconductor facility that allows efficient transportation of work in process (WIP) between lithography and inspection stations.

BACKGROUND OF THE DISCLOSURE

Modern semiconductor fabrication facilities (fabs) typically use a variety of different tools to perform various fabrication steps on a wafer, such as in the production of integrated circuits (ICs) on silicon wafers. For example, a fab may include tools for performing a variety of different processing and inspection steps such as, e.g., lithography, metrology, etching, ion implantation, deposition, etc. In order to efficiently transport work-in-process (WIP) among the various different tools to perform different fabrication steps on the WIP, a material handling system is generally employed in the fab. Material handling systems in current and next generation fabs typically include an automated material handling system (AMHS), and may also include some amount of manual transport of material by workers in the facility.

Automated material handling systems that are commonly employed in fabrication facilities include, e.g., overhead hoist transports (OHT), rail guided vehicles (RGV), automated guided vehicles (AGV), overhead shuttles (OHS), conveyor systems, and combinations thereof. Regardless of the particular type of AMHS used in the facility, the AMHS will often transport wafers to the various tools in lot containers, called cassettes or carriers, that each hold a plurality of wafers at a time. Commonly employed wafer carriers include mechanical interface (SMIF) pods and front opening unified pods (FOUPs), each of which may hold a plurality of wafers and enable access to individual wafers contained therein by a respective tool's material handler. With the emergence of 300 mm wafers, automated OHT systems which transfer the wafers in FOUPs have become increasingly common.

Each tool's station may generally include one or more material handlers for handling the WIP that is transported to it in lots via the fab AMHS. The material handler at a tool's station may generally include one or more load ports (LP) for loading and unloading FOUPs via the AMHS of the fab, as well as a robotic handling system for removing individual wafers from the FOUP and transferring them to the tool for a particular processing or measurement step.

The material handling system of the fab facility may also have one or more stockers for storing lots, such as, e.g., for temporarily storing wafers due to time deviations among the various tools, or for storage to facilitate transport of the stockers between various fabrication bays. Each stocker may have one or more load ports for loading and unloading FOUPs to and from the AMHS of the fab. The AMHS of a facility may also include a material control system (MCS) for controlling the flow WIP in the facility and issuing commands to the various transport and stocker modules in the AMHS.

By way of example and not by way of limitation, a typical AMHS in a semiconductor fab may utilize an OHT system that includes a track defining a route between various tools and/or stockers in the facility. The track may be located near a ceiling of the facility and have one or more computer-controlled OHT vehicles that travel on the track. Each vehicle may include a gripper for gripping a FOUP from a load port of a stocker or tool and a hoist mechanism that raises and lowers the gripper to raise and lower a FOUP. In a typical operation, the OHT vehicle may be positioned over a load port of a tool or stocker to lower the gripper and retrieve a FOUP from the load port. The hoist mechanism raises the FOUP and the OHT vehicle then transports the FOUP along the track to another load port of a tool or stocker in order to unload the FOUP for storage or a subsequent fabrication step. Each of these lot transfers may be performed according to a transport command received from the fab MCS.

There are currently available several different semiconductor fabrication facility layouts and material transportation architectures for moving wafers between the lithography processing stations and metrology or other inspection stations. Examples of metrology and/or inspection actions frequently performed in such configurations include, but are not limited to, overlay, critical dimension, focus, dose, film thickness, and macro and micro defect inspection. The rapid transportation of WIP from the lithography processing cell to the metrology station is particularly critical to lithographic semiconductor processing because of the possibility of lithography rework, wherein the WIP is returned to a lithography processing cell after metrology or inspection results, e.g., for resist removal and additional lithographic processing if the metrology or inspection results are outside of predetermined limits.

Figure 1:
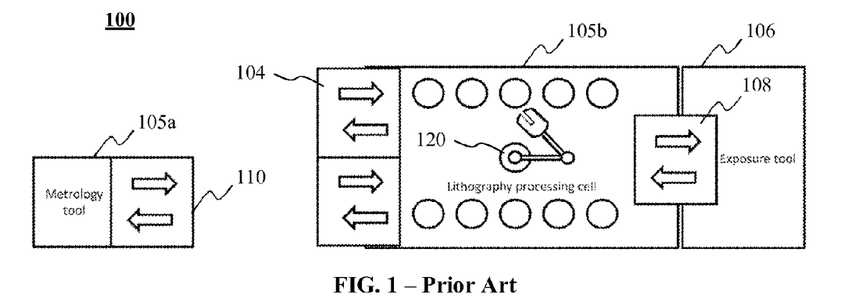
FIG. 1 is a schematic illustration of fab facility layout having a standalone metrology configuration.

In FIG. 1, one such layout is depicted having a standalone configuration 100, in which a post-lithography metrology station 105a is a separate entity with its own wafer handler 110. A robot 120 within the cell 105b transfers individual wafers between FOUPs at one or more load ports 104 and a processing tool 106. The robot 120 transfers wafers between the cell 105b and the tool 106 via a slit valve 108. The metrology station 105a can be arbitrarily located in the fabrication facility but is often located close to the lithography processing cell 105b. FOUPs can be transferred between the metrology state 105a and cell 105b via the fab's AMHS. This configuration is advantageous in terms of flexibility and cost of ownership as it allows a single metrology station to serve a number of lithography processing cells, relying on the AMHS of the fabrication facility to convey material to and from the station. In this standalone configuration, wafers are generally transferred between the lithography processing cell 105b and the metrology station 105a in cassettes. However, the stand alone configuration 100 suffers from a major drawback of long and varying time to result, while the metrology system 105a waits for the AMHS of the facility to transfer a completed lot from the lithography cell 105b.

Figure 2:
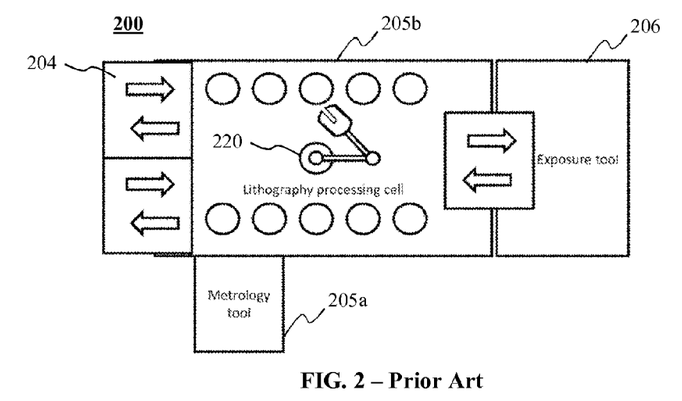
FIG. 2 is a schematic illustration of a fab facility layout having an integrated metrology configuration.

In FIG. 2, another such layout is depicted having an integrated metrology configuration 200, in which the metrology station 205a is integrated with a lithography processing cell 205b. As in the configuration 100 shown in FIG. 1, wafers are transferred between FOUPs at one or more load ports 204 and the cell 205b by a robot 220. In this configuration, the robot 220 can directly transfer single wafers between a lithography tool 206 and the metrology station 205a for measurement. A crucial benefit of the integrated configuration 200 is that of time to result since wafers can be individually transferred into the metrology station 205a prior to completion of processing of the whole lot, thereby allowing feedback of results within lot processing time.

Figure 3:
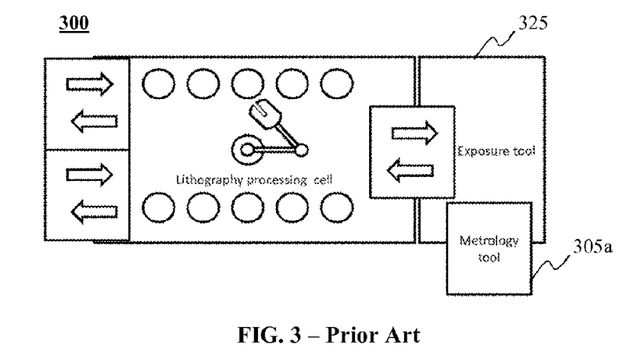
FIG. 3 is a schematic illustration of a fab facility layout having an embedded metrology configuration.

In FIG. 3, yet another such layout is depicted having an embedded metrology configuration 300, whereby the metrology station 305a is integrated into the exposure tool 325, and single wafers are transferred from the exposure tool 325 to the metrology station 305a for measurement immediately subsequent to exposure and prior to subsequent processing, such as develop or post exposure bake. This has additional benefits in terms of time to result but suffers from metrology challenges due to low image contrast prior to processing.

Both the integrated configurations and embedded metrology configurations suffer from cost of ownership disadvantages since the metrology station is dedicated to the lithography cell, resulting in substantial idle times for the metrology station during and between lot processing periods. Likewise, the standalone configuration suffers from long and varying time to result because it relies on the facility level AMHS to transfer completed lots form the lithography station.

It is within this context that aspects of the present disclosure arise.

SUMMARY OF THE DISCLOSURE

According to an aspect of the present disclosure an apparatus may comprise a dedicated material handling module having a dedicated automated material handling system (AMHS) that defines a transport route between a first tool and a second tool selected from a plurality of tools in a fabrication facility. The dedicated may be configured to transport wafer carriers between the first tool and the second tool or vice versa independent of a fabrication facility AMHS that is configured to transport wafer carriers among the plurality of tools.

In some implementations, the apparatus may further include the first tool. In some implementations, the first tool may be a substrate processing tool and the second tool may be an analysis tool. In some implementations, the processing tool may be a lithography tool and the analysis tool may be a metrology tool or an inspection tool. In other implementations the dedicated material handling module may further include a mini stocker, wherein the mini stocker interfaces with the transport route of the dedicated AMHS. In still other implementations, the fabrication facility AMHS may be an overhead hoist transport (OHT) system and a transport route of the fabrication facility AMHS may be defined by a track that extends to each tool in the plurality. In yet other additional implementations, the dedicated AMHS may be an OHT system and the transport route of the dedicated AMHS may be defined by a track that extends between the processing tool and the review tool. In further implementations, the substrate carriers may be front opening unified pods (FOUPs).

In certain alternative implementations, the wafer carriers may be FOUPs; the dedicated material handling module may further include a mini stocker; the facility AMHS is an OHT system and the transport route of the first AMHS is defined by a track that extends to the each tool in the plurality; and the dedicated AMHS is an OHT system and the transport route of the second AMHS may be defined by a track interfaces with the mini stocker and extends between the first tool and the second tool.

In certain other alternative implementations the fabrication facility AMHS may be an OHT system and a transport route of the facility AMHS may be defined by a track that extends to the each tool in the plurality and the dedicated AMHS may also be an OHT system and the transport route of the dedicated AMHS is defined by a track that extends to each tool in the subset.

According to another aspect of the present disclosure, a method may be implemented in a fabrication facility having a facility material handling system (AMHS) and a plurality of tools. The facility material handling system define a transport route connecting the plurality of tools in the fabrication facility, the facility AMHS may be configured to transport wafer carriers. The method may comprise installing a dedicated material handling module at the facility, said dedicated material handling module including a dedicated AMHS that defines a transport route connecting a first tool and a second tool selected from the plurality of tools.

The dedicated AMHS is configured to transport substrate carriers between the first tool and the second tool or vice versa independent of the facility AMHS. According to certain implementations, the first tool may be a processing tool and the second tool may be an analysis tool. The processing tool may be a lithography tool and the analysis tool may be a metrology tool or inspection tool. In some implementations the facility AMHS may be an overhead track (OHT) system and the dedicated AMHS may also be an OHT system. In such implementations, installing the dedicated material handling module may include positioning a track of the second AMHS near a ceiling of the fabrication facility and below a track of the first AMHS. In some implementations, installing the dedicated material handling module may include positioning a track of the second AMHS between the processing tool and the analysis tool. In some implementations the dedicated material handling module further includes a mini stocker.

According to an additional aspect of the present disclosure, an alternative method may be implemented in a fabrication facility having a facility material handling system (AMHS) and a plurality of tools. The facility material handling system may define a transport route connecting the plurality of tools in the fabrication facility. The facility AMHS may be configured to transport wafer carriers. The alternative method may comprise performing a first set of one or more wafer processing steps on one or more semiconductor wafers using a first tool of the plurality of tools; and transferring the one or more semiconductor wafers from the first tool to a second tool selected from the plurality of tools in a wafer carrier via a dedicated material handling module. The dedicated material handling module may include a dedicated AMHS that defines a transport route connecting the first tool and the second tool. The dedicated AMHS may be configured to transport substrate carriers between the first tool and the second tool or vice versa independent of the facility AMH.

In some implementations of the alternative method, performing the first set of wafer processing steps may include fabricating a semiconductor device on a wafer. In some implementations, the second tool may be an analysis tool. In some implementations, the alternative method may further comprise examining the wafer with the analysis tool to obtain results, and transporting the wafer in a wafer carrier back to the first tool with the dedicated material handling module when the results are outside of predetermined limits.

BRIEF DESCRIPTION OF THE DRAWINGS

Objects and advantages of the present disclosure will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the illustrative embodiments of the invention described below are set forth without any loss of generality to, and without imposing limitations upon, the claimed invention.

Aspects of the present disclosure are related to material handling systems in a fabrication facility that include both a facility level AMHS that transports lots of material between a plurality of tools in the facility, and a dedicated material handling module that transports lots of material between a first tool and a second tool selected from the plurality of tools in the facility. Like the facility level AMHS, the dedicated material handling module may be configured to transport wafer lots in containers, such as FOUPs or other wafer carriers, rather than individual wafers between tools in the facility for fabrication steps at different tools. Unlike the facility level AMHS, which is responsible for transport of WIP among all or a large number of tools in the facility, the scope of the dedicated material handling module is limited to the transport of lots between the two selected tools in order to maximize the efficiency of transport of WIP in the vicinity of those selected tools. The two tools may be selected from the plurality of facility tools as a subset for which repeated transport therebetween is common in the facility due to material flow concerns related to the fabrication process. Accordingly, the dedicated material handling module may facilitate more efficient transport of material between those tools than would be otherwise be achieved by transporting material via the facility level AMHS.

In one aspect of the present disclosure, these two tools may be a processing tool and an analysis tool in order to accelerate rework due to results from the review tool being outside of predetermined limits. By way of example and not by way of limitation, the review tool may be an inspection or metrology tool and the processing tool may be a lithography tool, such as an exposure tool, etching tool, deposition tool, or other tool as may be commonly employed in a semiconductor fab.

As used herein, the term "analysis tool" is intended to cover tools used to perform measurements on a substrate before, during, after or between substrate processing steps. Analysis tools may be categorized into subclasses, including, but not limited to metrology tools, inspection tools, and review tools.

A metrology tool is generally configured to perform an analysis by making measurements and providing outputs that correspond to the value of some physical property. The value output is typically a numerical value or set of numerical values, which may be transmitted or stored in analog or digital form. Examples of metrology tools include, but are not limited to overlay tools, interferometers, critical dimension (CD) tools (e.g., CD scanning electron microscope (CD-SEM)), film thickness tools, ion implant metrology tools, surface profiling tools, resistivity metrology tools, reticle pattern placement metrology tools, edge metrology tools, reflectometers, and ellipsometers.

Specific examples of commercially available overlay metrology tools include the Archer series overlay tools from KLA-Tencor Corporation of Milpitas, Calif.

Examples of optical CD metrology tools include SpectraShape optical CD tools from KLA-Tencor Corporation of Milpitas, Calif.

Examples of optical film thickness/refractive index/stress metrology tools include Aleris family, ASET-FSx, and SpectraFx tools from KLA-Tencor Corporation of Milpitas, Calif.

Examples of metrology tools for measuring wafer geometry and topography include WaferSight tools from KLA-Tencor Corporation of Milpitas, Calif. In addition, the SURFmonitor module for Surfscan SPx series tools from KLA-Tencor can indicate sub-angstrom surface topography variation on blanket films and bare substrates.

Examples of ion implant metrology tools include ThermaProbe tools from KLA-Tencor Corporation of Milpitas, Calif.

Examples of surface profiling metrology tools include HRP-x50 automated stylus-based surface profilers from KLA-Tencor Corporation of Milpitas, Calif.

Examples of resistivity metrology tools include RS-x00 sheet resistance mapping tools from KLA-Tencor Corporation of Milpitas, Calif.

Examples of reticle pattern placement metrology tools include IPRO Series tools from KLA-Tencor Corporation of Milpitas, Calif.

Examples of edge metrology tools include VisEdge Family tools from KLA-Tencor Corporation of Milpitas, Calif.

An inspection tool is generally configured to look for defects, i.e., something that is out of the ordinary. Typical output of an inspection tool is a count of defects per area for a substrate or portion of a substrate. Examples of inspection tools include, but are not limited to optical and electron beam wafer inspection systems for patterned or unpatterned wafers, macro defect inspection tools, edge defect inspection tools, infrared inspection tools, and reticle inspection tools.

Specific examples of commercially available inspection tools include, but are not limited to the following.

Optical wafer inspection tools for patterned wafers include 28XX series and 29XX series broadband optical defect inspection tools and Puma series laser-based optical defect inspection tools and the 8900 high-speed brightfield/darkfield optical defect inspection system; all of which are available from KLA-Tencor Corporation of Milpitas, Calif.

Electron beam wafer inspection tools for patterned wafers include the eS800 electron beam defect inspection system from KLA-Tencor Corporation of Milpitas, Calif.

Optical wafer inspection tools for unpatterned wafers include the Surfscan SPx and series and SURFmonitor (SURFmonitor is an option on an SPx tool) wafer defect inspection tools from KLA-Tencor Corporation of Milpitas, Calif.

Examples of edge defect inspection tools include VisEdge family tools from KLA-Tencor Corporation of Milpitas, Calif.

Examples of macro defect inspection tools include LDS infrared defect inspection tools and review station from KLA-Tencor Corporation of Milpitas, Calif.

Examples of infrared defect inspection tools include IRIS infrared defect inspection tools and review station from KLA-Tencor Corporation of Milpitas, Calif.

Examples of reticle inspection tools include TeraFab series Photomask inspection tools from KLA-Tencor Corporation of Milpitas, Calif.

Inspection tools may also be configured for back end of line (BEOL) inspection of fabricated devices. Examples of BEOL inspection tools include, but are not limited to, component inspection tools configured to inspect various semiconductor components that are handled in a tray, such as microprocessors or memory chips. Component defect inspection tool capabilities include, but are not limited to: 3D coplanarity inspection; measurement of the evenness of the contacts; and 2D surface inspection to check the package's surface aspects, the identification mark and the orientation. BEOL inspection tools may also be configured to inspect diced or undiced wafers, or diced wafers mounted on film frame carriers. Such tools may be configured to inspect surface quality of the wafers, the quality of the wafer cutting, or wafer bumps.

Commercially available examples of BEOL inspection tools include, but are not limited to component inspectors, such as the ICOS CI-T620, ICOS CI-T120/CI-T130, ICOS CI-T120S/CI-T130S, and ICOS CI-3050 model tools from KLA-Tencor Corporation of Milpitas, Calif.

A review tool is generally configured to take the output of a metrology or inspection tool and investigate further. For review of metrology, the review tool may be configured to investigate why the value is different. For inspection the review tool may be configured to investigate the nature of defects discovered by an inspection tool. Examples of review tools include electron beam, optical, or infrared review tools. Examples of electron beam review tools include the eDR-7000 series SEM-based defect review and classification systems from KLA-Tencor Corporation of Milpitas, Calif. Examples of optical review tools include INX-3x00 series automated, full-spectrum optical review systems from KLA-Tencor Corporation of Milpitas, Calif. Examples of infrared review tools include the IRIS infrared inspection and review station from KLA-Tencor Corporation of Milpitas, Calif.

It is noted that some tools can implement both metrology and review functions, some can implement review and inspection functions, some can implement metrology and inspection functions, and some can implement all three functions. Therefore, it is possible for two or more of these functions to be implemented by the same type of tool or, in some cases, the same tool.

As used herein, the term "processing tool" generally refers to any of a number of different types of tools used to perform various fabrication processes on the substrate. Examples of such processes include, but are not limited to patterning, etching, material deposition, resist stripping, cleaning, polishing, ion implantation, annealing.

By way of example, and without limitation of embodiments of the invention, a processing tool may generally include a lithographic patterning tool such as a scanner or stepper developer. Such developers are similar in operation to a slide projector or a photographic enlarger. Such tools are often used in photolithographic processes used to form microscopic circuit elements on the surface of a semiconductor wafer. In the patterning tool, a substrate, e.g., a semiconductor wafer, may be retained on a stage, which may include a chuck, e.g., a vacuum chuck or an electrostatic chuck. Elements of a circuit or other component to be created on the IC are reproduced in a pattern of transparent and opaque areas on the surface of a photomask or reticle. The pattern on the reticle often corresponds to a pattern for a single die or chip. Light from a source passes through the reticle and forms an image of the reticle pattern. The image is focused and sometimes reduced by a lens, and projected onto the surface of a substrate that is coated with a photoresist. The focused image on the resist is often referred to as an exposure field. After exposure, the coated substrate may be chemically developed, causing the photoresist to dissolve in certain areas according to the amount of light the areas received during exposure. This transfers the pattern on the reticle to the resist. The patterning tool may be equipped with heater elements, such as heat lamps, to facilitate heating of the resist either before or after exposure, e.g., to harden it. A patterning tool may be a stepper with an alignment system that moves the substrate after exposing one die so that another portion of the substrate may be exposed with the same exposure field.

The processing tool may alternatively be configured as a scanner. Scanners are steppers that increase the length of the exposure field by moving the reticle and stage in opposite directions to each other during the exposure. Instead of exposing the entire field at once, the exposure is made through an "exposure slit" that is as wide as the exposure field, but only a fraction of its length (e.g., a 8×26 mm slit for a 33×26 mm field is an industry standard). The image from the exposure slit is scanned across the exposure area on the substrate.

By way of example, and without loss of generality, the processing tool may also be configured as an electron beam lithography tool. Unlike the scanner and the stepper, an electron beam lithography tool is a direct write lithography system. A beam of electrons is directed across the substrate covered with a resist without the need for a photomask. By way of example and without loss of generality, the processing tool may also be a directed self-assembly (DSA) lithography tool. DSA utilizes natural processes such as preferred bonding orientations, within materials to produce ordered structures. Manipulation of these processes can be used to form stripes and can be fined tuned by altering the chemistry to achieve nanometric features.

In semiconductor fabrication, substrates with the developed resist may be subject to further processing, e.g., etching or deposition. Such processes may take place in other types of processing tools. Such processing tools may include spin-coaters, which deposit the resist on the substrate or pre-bake chambers, in which the resist is heated prior to exposure or developing in an exposure tool. By way of example, and without loss of generality, other types of processing tools include, but are not limited to, deposition tools, etch tools, ion implant tools, resist application tools, resist stripping tools, and chemical mechanical polishing (CMP) tools.

The facility level AMHS may include any of a variety of material handling systems commonly employed in semiconductor fabs, such as, e.g., an overhead hoist transport (OHT) system, a rail guided vehicle (RGV) system, an automated guided vehicle (AGV) system, an overhead shuttle (OHS) system, a conveyor system, or some combination thereof.

The dedicated material handling module may also include an automated material handling system, the scope of which is limited to the subset of tools for which it is selected. The AMHS employed by the dedicated module may be, e.g., an overhead hoist transport (OHT) system, a rail guided vehicle (RGV) system, an automated guided vehicle (AGV) system, an overhead shuttle (OHS) system, or a conveyor system. The type of material system utilized by the dedicated material handling module may be of a same type as a system employed by the facility level AMHS, or may be of a different type than the facility level AMHS.

The dedicated material handling module may further include a temporary storage unit, such as, e.g., a stocker, mini stocker, or buffer station that includes one or more load ports for temporarily storing lots for transport between the subset of tools. The temporary storage unit may be, e.g., a mini stocker in the form of an overhead buffer (OHB) station disposed near a ceiling of the facility and underneath or adjacent to a track of the dedicated material handling module so that it does not consume additional floor space in the facility. This OHB station may disposed above one of the tools in the subset, or arbitrarily along the route defined by the dedicated material handling module. Another type of mini-stocker that an AMHS system could us is a "Near Tool Buffer" which may be located in front of or next to a process/metrology tool. Such a mini-stocker may be part of the overall AMHS system.

Figure 4:
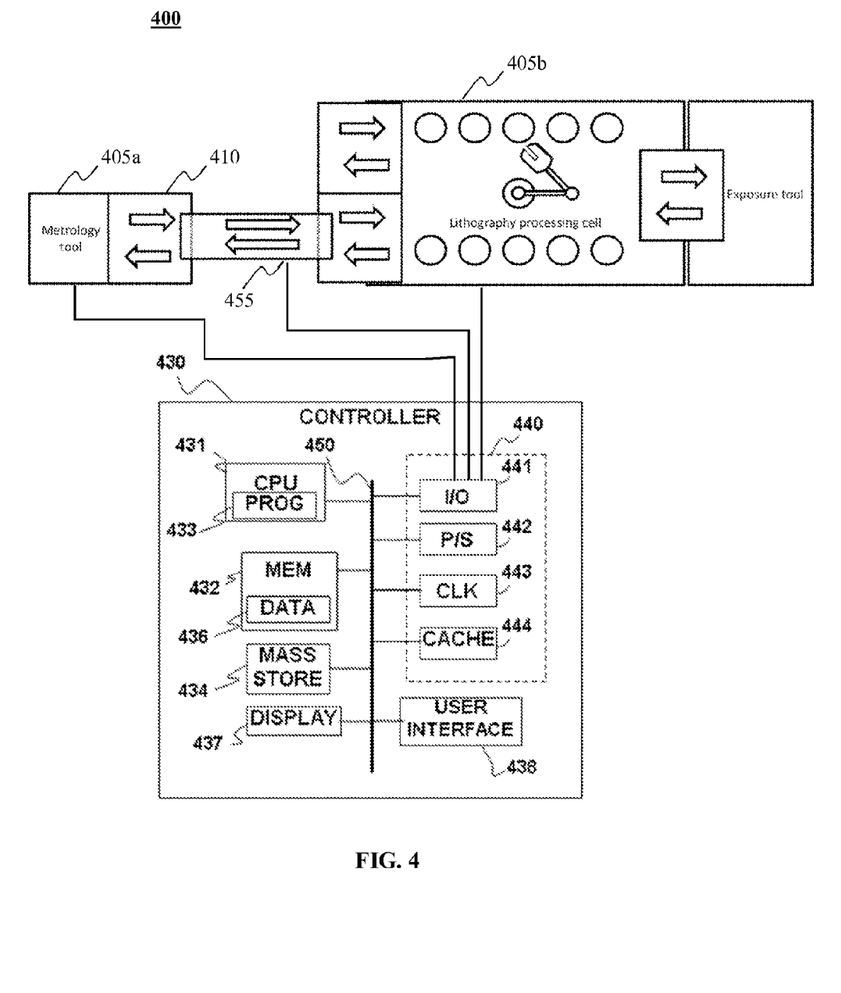
FIG. 4 is a schematic illustration of fab facility layout having a dedicated material handling module according to an embodiment of the present disclosure.

An example of an apparatus 400 according to an aspect of the present disclosure is depicted in FIG. 4, although it will be understood that many details are omitted from the embodiment shown in FIG. 4 for purposes of illustration. Similar to the stand alone configuration depicted in FIG. 1, the metrology station 405*a* includes a wafer handler 410 for receiving lot cassettes and transferring wafers onto the metrology measurement chuck. However, in contrast to the configurations mentioned above with reference to FIGS. 1-3, there is an additional dedicated material handling module 455 which transfers lot cassettes between a processing tool 405*b* (e.g., a lithography processing cell) and an analysis tool 405*a*, e.g., a metrology station.

The analysis tool 405*a*, processing tool 405*b* and dedicated material handling module 455 may operate under the control of a controller 430.

In one embodiment, the dedicated material handling module 455 may include a mini stocker and an automated material handling system in the form of an overhead hoist transportation (OHT) system. One example of an OHT system that may be implemented in a dedicated material handling module according to the present disclosure is described in U.S. Pat. No. 7,771,153 to Doherty et al., entitled "AUTOMATED MATERIAL HANDLING SYSTEM FOR SEMICONDUCTOR MANUFACTURING BASED ON A COMBINATION OF VERTICAL CAROUSELS AND OVERHEAD HOISTS", the entire disclosure of which is herein incorporated by reference.

In contrast to configurations mentioned above with reference to FIG. 1 through FIG. 3 and unique to the embodiment of FIG. 4, the use of this mini stocker and OHT system as a dedicated material handling module between the lithography processing cell 405*b* and the metrology station 405*a* has special significance due to the acceleration of the above described rework option. Although this may not achieve the same acceleration of time to result that is achieved by the integrated or embedded configurations, it can present a major cost of ownership advantage. In contrast to the integrated configurations or embedded configurations which dedicate the much higher cost metrology station, only the mini-stocker and OHT system of the material handling module 455 are dedicated to the lithography processing cell 405*b*. Accordingly, the metrology station 405*a* can receive WIP either rapidly and directly from the adjacent lithography cell 405*b* via the dedicated material handling module 455, or from other locations in the facility, such as, e.g., other lithography cells or post etch processing, via the overall fab level AMHS if material is not forthcoming locally.

Furthermore, it is noted that the time to result benefit of utilizing a dedicated material handling module in this manner may be two fold. For one, the mean time to result for lots may be reduced due to the dedicated material handling module creating a direct link between the metrology station and the lithography station. For another, the breadth of distribution (i.e. standard deviation) of times to result may be radically diminished due to the limited role of the dedicated module, thereby creating a more predictable and deterministic material flow in the fabrication facility.

An additional advantage to the present disclosure may be that, in some embodiments, the configuration may be retrofitted to existing fabrication facility architectures while consuming minimal or no additional fabrication facility real estate. By way of non-limiting example, in some embodiments the mini-stocker may be in the form of an overhead buffer (OHB) station disposed under or adjacent to a track of a dedicated OHT system. Accordingly, for the relatively modest cost of an additional material handling module dedicated between the two stations, improved time to result may be achieved. In an illustrative embodiment, a facility upgrade can be implemented by inserting the dedicated material handling module between the lithography cell and the metrology station, and physically below the fab level AMHS.

It is further noted that, from a factory automation perspective, the metrology station can now serve two scenarios. For one, the metrology station may receive WIP from a specific lithography processing cell to which it is linked through the dedicated material handling module. For another, the metrology station may receive WIP as a standalone metrology station via the fab level AMHS. This flexibility can ensure that the metrology station is not idle when the specific lithography processing cell is down, such as, for example, because of scheduled maintenance.

Figure 5:
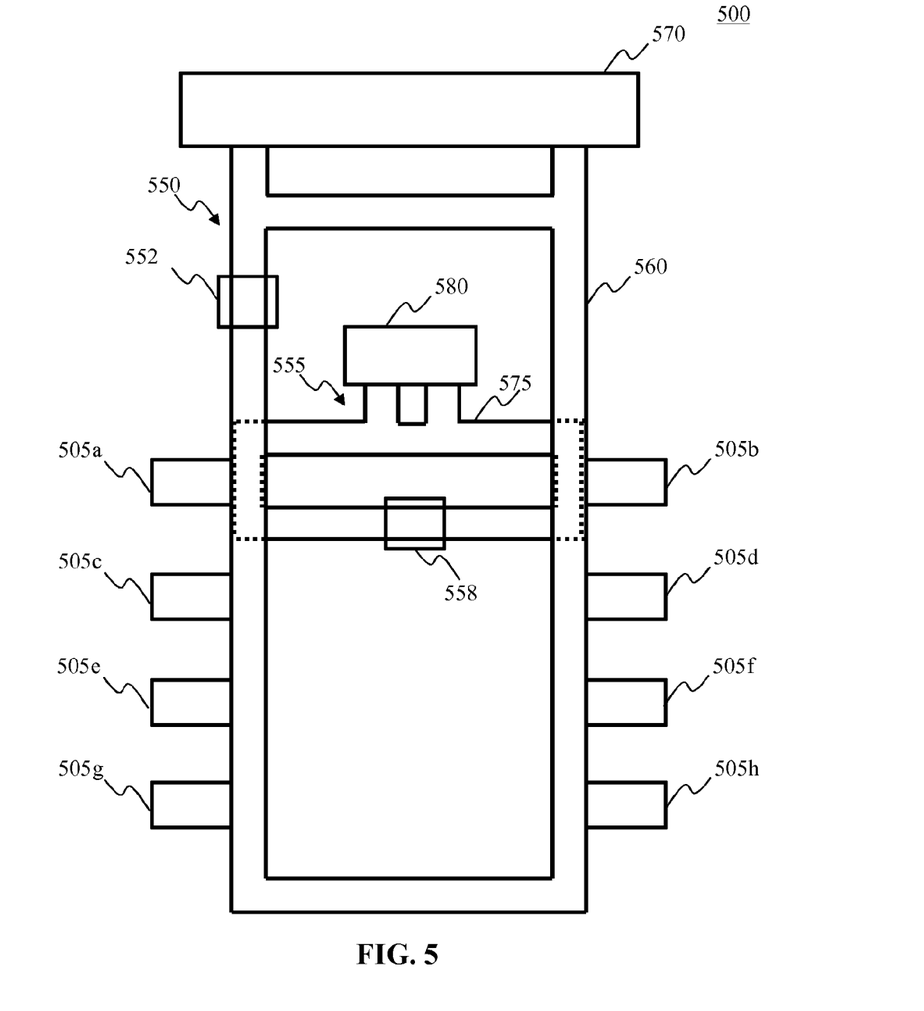
FIG. 5 is a schematic illustration of a fabrication facility having a dedicated material handling module and a facility level AMHS according to an embodiment of the present disclosure.

In FIG. 5, a material handling system in a semiconductor fabrication facility according to an embodiment of the present disclosure is depicted. In the illustrated embodiment, only a single bay of a facility having an intra-bay AMHS is depicted for purposes of illustration, but it can be appreciated that a material handling system in accordance with the present disclosure may include, e.g., inter-bay systems, intra-bay systems, or combinations thereof.

In the illustrated embodiment, the material handling system 500 includes a first AMHS 550, and a dedicated material handling module 555. The first AMHS 550 may define a transport route 560 that connects a plurality of tools 505*a-h* and a main stocker 570. The stocker 570 may generally have one or more load ports for input and output of cassettes and may provide storage of WIP during fabrication, such as may be desired, e.g., due to deviation in timing of fabrication steps performed at the different tool's stations 505*a-h*, or to facilitate the transport of cassettes to another bay.

In the illustrated embodiment, the first AMHS 550 is depicted as an overhead hoist transport (OHT) system having a track 560, which may be fixed near a ceiling of a fabrication facility. The track 560 defines a route to the plurality of tools 505*a-h* as well as to the stocker 570.

The first OHT system may also have one or more transport vehicles 552 that travel on the track 560, and which grip wafer carriers in order to transport work in process (WIP) from among the various tools 505*a-h* and the stocker 570. The material handling system may also include another automated system for transporting WIP interbay, in which case the material handling system of the facility may include a plurality of main stockers in order to facilitate interbay transport.

In the illustrated embodiment, the material handling system 500 further includes a dedicated material handling module 555, which has a second AMHS that is dedicated to transporting cassettes between the lithography station 505*a* and the inspection station 505*b*, thereby accelerating time to result due to rework based on results from inspection performed at station 505*b*. The AMHS of the dedicated material handling module 555 is also depicted as including an OHT system having a dedicated track 575, which, for example, may be disposed near a ceiling of the fabrication facility but lower than the track 560 of the first AMHS. The dedicated track 575 defines a transport route between the two tools 505*a* and 505*b* that runs a loop between the two tools and also interfaces with a mini stocker 580. The mini stocker may also have one or more load ports to enable temporary storage of lots transported between the two tools. One or more dedicated OHT vehicles 558 may be travel on the track and are configured to transport wafer carriers, such as FOUPs, and interface with load ports at the tools 505*a*, 505*b*, and mini stocker 580.

In the material handling system 500, each of the plurality of tools 505*a-h* may have one or more load ports for loading and unloading lots in wafer carriers via vehicles of the material handling system 500. The load ports of the plurality tools 505*a-h* interface with the track 560 of the first AMHS 550, while the loads ports of the lithography station 505*a* and inspection station 505*b* additionally interface with the track 575 of the dedicated material handling module 555. Accordingly, the subset of tools 505*a* and 505*b* may interface with both the first AMHS 550 and the second AMHS of the dedicated material handling module 555 via their respective tracks, thereby enabling entrance and exit of lots via the fab level AMHS, the dedicated material handling module 555, or a combination thereof.

In the illustrated embodiment, the mini stocker 580 of the dedicated module 555 may be located arbitrarily along the route defined by the track 575 of the dedicated module. However, in some embodiments, the mini stocker may be located at one of the tools, such as at the lithography tool 505*b*, by being disposed directly above the tool or being integrated into the tool's front end. In yet further embodiments, the mini stocker may be a free standing stocker located arbitrarily on the floor of the facility.

In this manner, the inspection station 505*a* can interface with the dedicated OHT system to transport WIP directly to the lithography station via the dedicated material handling module 555, but may still interface with the fab level AMHS 550 to transport WIP to other tools in the facility if needed, such as, e.g., another lithography station in the facility when the dedicated lithography station 505*b* is down due to scheduled maintenance. Utilizing the embodiment shown in FIG. 5, the inspection station 505*a* can be linked to the lithography station 505*b* via the dedicated module 555, thereby achieving some of the time to result benefits of the embedded configurations and integrated configurations mentioned above with reference to FIGS. 2 and 3. However, because the inspection station 505*a* may still interface with the facility level AMHS 550, it is not entirely dependent upon the lithography station 505*b* to which it is linked, as in the embedded and integrated configurations. This flexibility enables the high cost inspection station 505*a* to receive WIP from elsewhere in the facility, such as, e.g., another lithography station, when material is not forthcoming locally via from the linked station 505*b*.

In order to enable transport of WIP to a linked tool via either system, at least one of the tools linked by the dedicated module may have a load port that is accessible, either directly or via an intermediate interface, by both the fab level AMHS and the AMHS of the dedicated material handling module. In some embodiments, each of the linked tools are accessible by both the dedicated material handling module and the fab level AMHS, so that WIP may be transported to and from either linked tool via either system depending on the system schedule. In some other embodiments, only one of the linked tools, such as an inspection station, is accessible by both the fab level material handling system and the dedicated module AMHS, while the other is accessible to only the dedicated module.

In order to enable accessibility to a tool's load port by both the dedicated module and the facility level AMHS, a material handling system in accordance with the present disclosure may be set up in a variety of ways.

By way of example and not by way of limitation, where both the facility level AMHS and the dedicated module utilize the same type of system, they may be set up in such a manner that their guides do not prevent access to the tool by a vehicle of the other system. For example, if the fab level AMHS and the dedicated material handling module each utilize an OHT system, then the track of the dedicated OHT may be set up in such a manner that it does not physically block access to a tool by a vehicle on a track of the fab level OHT.

In some embodiments, in order to prevent the track of the dedicated OHT from blocking access to the tool by a vehicle of the fab level AMHS, each of the two tracks may be configured to access a different respective port, wherein these different respective ports may interface with a particular tool. For example, the track of the dedicated OHT may have a route that passes above a first port, and a track of the fab level AMHS may have a route that passes above a second port, wherein the track of the dedicated OHT does not pass over the second port to thereby leave it unobstructed allowing a vehicle of the fab level AMHS to drop down past the dedicated OHT track and access the second port. By way of example and not by way of limitation, these different ports may be different load ports of one of the tools, wherein the tool is equipped with multiple load ports. By way of further non-limiting example, the different ports may be different ports of a buffer station or other interfacing unit, wherein the system is equipped with a mechanism for moving lots between the different ports and/or from the different ports to a load port of the tool.

In some embodiments, at least one of the facility level AMHS and the dedicated OHT may include a vehicle having lateral motion capability in order to access ports that are located laterally offset from the track, which would enable a vehicle to access a port that is not disposed directly below its respective track. This would enable the two systems to interface with the same port without their respective tracks interfering with one another.

In some embodiments, a moveable port is provided that may occupy a plurality of positions, and the fab level AMHS and dedicated material handling module may interface with the port at different positions of the port. One example of a movable port is described by U.S. Pat. No. 7,771,153, which describes a carousel type stocker in which a plurality of load ports and/or storage locations in a stocker are moved to different positions in a rotating fashion. In some embodiments of the present disclosure, a material handling system may include a fab level AMHS and a dedicated material handling module which both interface with the carousel type stocker, such as, e.g., by defining routes that are adjacent to opposing sides of the carousel type stocker. The different routes may thereby enable the fab level AMHS to access a port of the stocker without the track of the dedicated material handling module interfering. By way of non-limiting example, this stocker may be further be located at or near a tool's front end, and a dedicated AMHS may be configured to transfer lots from the stocker to the tool.

By way of example and not by way of limitation, the dedicated material handling module may include a system that is a different type than the fab level AMHS. For example, if the fab level AMHS utilizes an OHT system, the dedicated material handling module may include a different type of system, such as an RGV system. Vehicles of each system may access the same load ports or storage units of the tools without their respective guides interfering with each other, e.g., without the rail of the dedicated RGV, which may be disposed near a floor of a facility, interfering with a track of the fab level OHT system, which may be disposed near a ceiling of the facility.

It is further noted that some combination of the above may be used to optimize the flow of material in the dedicated route and/or in a route defined by the fab level AMHS and enable interfaces between the tools and respective material handling systems as desired.

An advantageous aspect of the present disclosure is that a dedicated material module may be retrofitted to an existing facility AMHS. For example, turning to the illustrative embodiment of FIG. 5, the first AMHS 550 may be a preexisting facility level AMHS in a fabrication facility, and the dedicated module 555 may be retrofitted onto the system to achieve some or all of the benefits described herein. This ensures flexibility and compatibility with various material handling architectures while still achieving the time to result benefits mentioned above.

Aspects of the present disclosure provide an intermediate solution between the standalone configuration depicted in FIG. 1, and the embedded and integrated configurations depicted in FIG. 2 and FIG. 3. According to aspects of the present disclosure substantially all of the cost of ownership benefits of the standalone may be achieved, while also enabling substantial acceleration of time to result similar to the integrated and embedded configurations mentioned above.

Although aspects of the present disclosure have been described with particular reference to implementations in a lithography cell of a semiconductor fabrication facility, it is understood that the present disclosure may be implemented broadly in conjunction with other process modules, such as, e.g., etching, ion implantation, deposition, etc.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A material handling apparatus, comprising:
a dedicated material handling module having a dedicated automated material handling system (AMHS) that defines a transport route between a first tool and a second tool selected from a plurality of tools in a fabrication facility, wherein the plurality includes more tools than just the first and second tools, wherein the dedicated AMHS is configured to transport wafer carriers between the first tool and the second tool or vice versa independent of a fabrication facility AMHS that is configured to transport the wafer carriers among the plurality of tools, wherein the wafer carriers are front opening unified pods (FOUPs).

2. The material handling apparatus of claim 1,
wherein the wafer carriers are FOUPs;
wherein the dedicated material handling module further includes a mini stocker;
wherein the facility AMHS is an overhead hoist transport (OHT) system and the transport route of the first AMHS is defined by a track that extends to the each tool in the plurality; and
wherein the dedicated AMHS is an OHT system and the transport route of the dedicated AMHS is defined by a track interfaces with the mini stocker and extends between the first tool and the second tool.

3. The material handling apparatus of claim 1, wherein the first tool is a substrate processing tool and the second tool is an analysis tool.

4. The material handling apparatus of claim 3, wherein the processing tool is a lithography tool and the analysis tool is a metrology tool or an inspection tool.

5. The material handling apparatus of claim 3, wherein the dedicated material handling module further includes a mini stocker, wherein the mini stocker interfaces with the transport route of the dedicated AMHS.

6. A material handling apparatus, comprising:
a dedicated material handling module having a dedicated automated material handling system (AMHS) that defines a transport route between a subset of a plurality of tools in a fabrication facility, wherein the subset contains fewer than all the tools in the plurality, wherein the dedicated AMHS is configured to transport wafer carriers between the subset of the plurality of tools or vice versa independent of a fabrication facility AMHS that is configured to transport the wafer carriers among the plurality of tools, wherein the wafer carriers are front opening unified pods (FOUPs).

* * * * *